United States Patent
Bawendi et al.

(10) Patent No.: US 8,664,640 B2
(45) Date of Patent: Mar. 4, 2014

(54) NON-VOLATILE MEMORY DEVICE INCLUDING SEMICONDUCTOR CHARGE-TRAPPING MATERIAL PARTICLES

(75) Inventors: Moungi G. Bawendi, Boston, MA (US); Vladimir Bulović, Lexington, MA (US); Seth A. Coe-Sullivan, Watertown, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1365 days.

(21) Appl. No.: 10/958,659

(22) Filed: Oct. 6, 2004

(65) Prior Publication Data

US 2005/0072989 A1     Apr. 7, 2005

Related U.S. Application Data

(60) Provisional application No. 60/508,272, filed on Oct. 6, 2003.

(51) Int. Cl.
*H01L 29/788* (2006.01)
*H01L 29/792* (2006.01)

(52) U.S. Cl.
USPC .......... 257/24; 257/314; 257/325; 257/E29.3; 257/E29.309

(58) Field of Classification Search
USPC .......... 257/14–27, 314–317, 321–325, E29.3, 257/E29.309
See application file for complete search history.

(56) References Cited

U.S. PATENT DOCUMENTS

| | | |
|---|---|---|
| 5,260,957 A | 11/1993 | Hakimi et al. |
| 5,293,050 A | 3/1994 | Chapple-Sokol et al. |
| 5,354,707 A | 10/1994 | Chapple-Sokol et al. |
| 5,395,791 A | 3/1995 | Cheng et al. |
| 5,422,489 A | 6/1995 | Bhargava |
| 5,505,928 A | 4/1996 | Alivisatos et al. |
| 5,525,377 A | 6/1996 | Gallagher et al. |
| 5,537,000 A | 7/1996 | Alivisatos et al. |
| 5,585,640 A | 12/1996 | Huston et al. |
| 5,606,163 A | 2/1997 | Huston et al. |
| 5,613,140 A | 3/1997 | Taira |
| 5,677,545 A | 10/1997 | Shi et al. |
| 5,751,018 A | 5/1998 | Alivisatos et al. |
| 6,054,495 A | 4/2000 | Markowitz et al. |
| 6,057,561 A | 5/2000 | Kawasaki et al. |
| 6,090,666 A | 7/2000 | Ueda et al. |

(Continued)

FOREIGN PATENT DOCUMENTS

| | | |
|---|---|---|
| WO | WO9610282 | 4/1996 |
| WO | WO 97/10175 | 3/1997 |

(Continued)

OTHER PUBLICATIONS

Alivisatos, "Perspectives on the Physical Chemistry of Semiconductor Nanocrystals," J. Phys. Chem. 1996(100):13226-13239, 1996.

(Continued)

*Primary Examiner* — Marcos D. Pizarro
(74) *Attorney, Agent, or Firm* — Steptoe & Johnson LLP

(57) ABSTRACT

A memory device can include an active layer that has a selectable lateral conductivity. The layer can include a plurality of nanoparticles.

11 Claims, 5 Drawing Sheets

(56) References Cited

U.S. PATENT DOCUMENTS

| | | | |
|---|---|---|---|
| 6,103,868 | A | 8/2000 | Heath et al. |
| 6,139,585 | A | 10/2000 | Li |
| 6,157,047 | A | 12/2000 | Fujita et al. |
| 6,207,229 | B1 | 3/2001 | Bawendi et al. |
| 6,294,401 | B1 | 9/2001 | Jacobson et al. |
| 6,322,901 | B1 | 11/2001 | Bawendi et al. |
| 6,337,117 | B1 | 1/2002 | Maenosono et al. |
| 6,379,635 | B2 | 4/2002 | O'Brien et al. |
| 6,447,698 | B1 | 9/2002 | Ihara et al. |
| 6,501,091 | B1 | 12/2002 | Bawendi et al. |
| 6,506,564 | B1 | 1/2003 | Mirkin et al. |
| 6,576,291 | B2 | 6/2003 | Bawendi et al. |
| 6,586,785 | B2 * | 7/2003 | Flagan et al. ............... 257/261 |
| 6,607,829 | B1 | 8/2003 | Bawendi et al. |
| 6,797,412 | B1 | 9/2004 | Jain et al. |
| 6,846,565 | B2 | 1/2005 | Korgel et al. |
| 6,864,626 | B1 | 3/2005 | Weiss et al. |
| 6,918,946 | B2 * | 7/2005 | Korgel et al. ............... 75/362 |
| 2001/0005495 | A1 | 6/2001 | O'Brien et al. |
| 2003/0017264 | A1 | 1/2003 | Treadway et al. |
| 2003/0042850 | A1 | 3/2003 | Bertram et al. |
| 2004/0265622 | A1 | 12/2004 | Sadasivan et al. |

FOREIGN PATENT DOCUMENTS

| | | |
|---|---|---|
| WO | WO 99/26299 | 5/1999 |
| WO | WO 0237500 A1 * | 5/2002 |
| WO | WO 2005004253 | 1/2005 |
| WO | WO 2005017951 | 2/2005 |

OTHER PUBLICATIONS

Coe, S. et al. "Electroluminescence from single monolayers of nanocrystals in molecular organic devices," *Nature* 420, 800-803 (Dec. 19, 2002).

Colvin, et al., "Light-emitting diodes made from cadmium selenide nanocrystals and a semiconducting polymer," *Nature* 370(6488):354-357, Aug. 4, 1994.

Dabbousi, et al., "(CdSe)ZnS core-shell quantum dots: synthesis and characterization of a size series of highly luminescent nanocrystallites," J. Phys. Chem. B 101(46):9463-9475, Nov. 13, 1997.

Dabbousi, et al., "Electroluminescence from CdSe quantum-dot/polymer composites," Appl. Phys. Lett. 66(11):1316-1318, Mar. 13, 1995.

Danek, et al., "Synthesis of Luminescent Thin-Film CdSe/ZnSe Quantum Dot Composites Using CdSe Quantum Dots Passivated with an Overlayer of ZnSe," Chem. Mater. 8(1):173-180, 1996.

De Blauwe, J. "Nanoparticle Nonvolatile Memory Devices, " *IEEE Trans. Nanotechnology* 1, 72 (2002).

Diehl, "Fraunhofer LUCOLEDs to replace lamps," III-Vs Rev. 10(1), 1997.

Empedocles, et al., "Photoluminescence Spectroscopy of Single CdSe Nanocrystallite Quantum Dots," Phys. Rev. Lett. 77(18):3873-3876, Oct. 1996.

Empedocles, et al., "Quantum-Confined Stark Effect in Single CdSe Nanocrystallite Quantum Dots," Science 278:2114-2117, Dec. 1997.

Guha, et al., "Hybrid organic-inorganic semiconductor-based light-emitting diodes," J. Appl. Phys. 82(8):4126-4128, Oct. 15, 1997.

Hines, et al., "Synthesis and Characterization of Strongly Luminescing ZnS-Capped CdSe Nanocrystals," J. Phys. Chem. 100:468-471, Jan. 1996.

Kagan, et al., "Electronic Energy Transfer in CdSe Quantum Dot Solids," Phys. Rev. Lett. 76(9): 1517-1520, 1996.

Kagan, et al. "Long-range resonance trasfer of electronic excitations in close-packed CdSe quantum-dot solids, " Phys. Rev. B 54(12):8633-8643, 1996.

Kortan, et al., "Nucleation and Growth of CdSe on ZnS Quantum Crystallite Seeds, and Vice Versa, in Inverse Micelle Media," J. Am. Chem. Soc. 112:1327-1332, 1990.

Kuno, et al., "The band edge luminescence of surface modified CdSe nanocrystallites: Probing the luminescing state," J. Chem. Phys. 106(23):9869-9882, Jun. 1997.

Lawless, et al., "Bifunctional Capping of CdS Nanoparticles and Bridging to TiO2," J. Phys. Chem. 99:10329-10335, 1995.

Leatherdale, et al., "Photoconductivity in CdSe quantum dot solids", vol. 62, No. 4, pp. 2669-2680, (Jul. 15, 2000).

Matsumoto, et al., "Preparation of Monodisperse CdS Nanocrystals by Size Selective Photocorrosion," J. Phys. Chem 100(32):13781-13785, 1996.

Mattoussi et al., "Electroluminescence from heterostructures of poly(phenylene vinylene) and inorganic CdSe nanocrystals," J. Appl. Phys. 83(12):7965-7974, 1998.

Morgan, N.Y., et al, "Electronic Transport in Films of Colloidal CdSe NCs," *Phys. Rev. B* 66, 075339-1 (2002).

Murray, et al., "Synthesis and Characterization of Nearly Monodisperse CdE(E=S, Se, Te) Semiconductor Nanocrystallites," J. Am. Chem. Soc. 115(19):8706-8715, 1993.

Murray et al., *Annu. Rev. Mat. Sci.*, 30, 545-610 (2000).

Nirmal, et al., "Fluorescence Intermittency in single Cadmium Selenide Nanocrystals," Nature 383:802-804, Oct. 1996.

Ridley, B.A. et al. "All-Inorganic Field Effect Transistors Fabricated by Printing," Science 286:746-749, 1999.

Schlamp et al., "Improved efficiencies in light emitting diodes made with CdSe(CdS) core/shell type nanocrystals and a semiconducting polymer", J. Appl. Phys 82(11):5837-5842, 1997.

Spanhel et al., "Photochemistry of Colloidal Semiconductors. Surface Modification and Stability of Strong Luminescing CdS Particles", J. Am. Chem. Soc.,109 (19), pp. 5649-5655, (1987).

Tiwari, S. el al., "Volatile and Non-Volatile Memories in Silicon with Nano-Crystal Storage," IEDM 95-521 (1995).

Ekimov, A.I. et al., "Quantum Confined Atoms of Doped ZnO Nanocrystals," *Phys. Stat. Sol* (b) 229, No. 2, 897-901 (2002).

Ekimov, A.I. et al., "Spin-flip and acoustic-phonon Raman scattering in CdS nanocrystals," *Physical Review B*, vol. 58, No. 4, 15 (Jul. 1998-II), 2077-2087.

Ekimov, A.I. et al., "CdS nanocrystal growth in thin silica films: evolution of size distribution function," *Journal of Crystal Growth* 184/185 (1998) 360-364.

Ekimov, A.I. et al., "Dynamics of excitons in CuBr nanocrystals: Spectral-hole burning and transient four-wave-mixing measurements," *Physical Review B*, vol. 57, No. 3, Jan. 15, 1998-1, 1774-1783.

Ekimov, A.I. et al., "Size-selective resonant Raman scattering in CdS doped glasses," *Physical Review B*, vol. 57, No. 1, Jan. 1, 1998-1, 341-346.

Ekimov, A.I. et al., "Growth and optical properties of semiconductor nanocrystals in a glass matrix," *Journal of Luminescence* 70 (1996) 1-20.

Ekimov, A.I. et al., "Size dependence of acoustic and optical vibrational modes of CdSe nanocrystals in glasses," *Journal of Non-Crystalline Solids* 197 (1996) 238-246.

Ekimov, A.I. et al., "Subpicosecond dynamics of confined excitons in CuCl nanocrystals," *Materials Science and Engineering* A217/218 (1996) 167-170.

Ekimov, A.I. et al., "Enhancement of electron-hole exchange interaction in CdSe nanocrystals; A quantum confinement effect," *Physical Review B*, vol. 53, No. 3, Jan. 15, 1996-1, 1336-1342.

Ekimov, A.I. et al., "Subpicosecond dynamics of confined excitons and optical nonlinearities of CuCl quantum dots," *Journal of Luminescence* 66 & 67 (1996) 406-409.

Ekimov, A.I. et al., "Size-dependent Electron-Hole Exchange Interaction in CdSe Quantum Dots, *Il Nuovo Cimento*," vol. 17, Nos. 11-12, (1995) 1407-1412.

Ekimov, A.I. et al., "Polaron and Exciton-Phonon Complexes in CuCl Nanocrystals," *Physical Review Letters*, vol. 74, No. 9, Feb. 27, 1995, p. 1645.

Ekimov, A.I. et al., "Growth of CdSe nanocrystals in ion-implanted $SiO_2$ films," *Journal of Crystal Growth* 151 (1995) 38-45.

Ekimov, A.I. et al., "Effects of Resonance on Low-Frequency Raman Scattering From Semiconductor Nanocrystals," *Radiation Effects and Defects in Solids*, 1995, vol. 137, pp. 45-50.

Ekimov, A.I. et al., "Optical Properties of Oxide Glasses Doped by Semiconductor Nanocrystals," *Radiation Effects and Defects in Solids*, 1995, vol. 134, pp. 11-22.

(56) References Cited

OTHER PUBLICATIONS

Ekimov, A.I. et al., "Enhancement of Exciton Exchange Interaction by Quantum Confinement in CdSe Nanocrystals," *Jpn. J. Appl. Phys*, vol. 34, 12-14 (1994).

Ekimov, A.I. et al., "Growth of CdS nanocrystals in silicate glasses and in thin $SiO_2$ films in the Initial states of the phase separation of a solid solution," *Semiconductors*, 28 (5), May 1994, 486-493.

Ekimov, A.I. et al., "Interface effects on the properties of confined excitons in CuCl microcrystals," *Journal of Luminescence* 60 & 61 (1994) 396-399.

Ekimov, A. I., "Surface Recombination of Nonequilibrium Electron-Hole Plasma in Laser-Modified Semiconductor-Doped Glasses," *Solid State Communications*, vol. 87, No. 6, 577-580 (1993).

Ekimov, A I. "Dynamics of Nonlinear Optical Response of CuBr-Doped Glasses," *Superlattices and Microstructures*, vol. 3, No. 2, 199-202 (1993).

Ekimov, A. I., "Absorportion and intensity-dependent photoluminescence measurements on CdSe quantum dots: assignment of the first electronic transitions," *Journal of the Optical Society of America*, vol. 10, Nos. 1-12, 100-107 (1992).

Ekimov, A.I. et al. "Preparation and investigation of $SiO_2$ films activated by CdS semiconductor nanocrystals," *Soviet Physics Semiconductors*, vol. 26, 57-59 (1992).

Ekimov, A.I. et al. "Generation of reflected second harmonic at semiconductor quantum dots," *JETP Letters*, vol. 55, No. 8, 435-439 (1992).

Ekimov, A.I. et al. "Dimensional Effects in Luminescence Spectra of Zero-Dimensional Semiconductor Structures," *Bulletin of the Russian Academy of Sciences*, vol. 56, No. 2, pp. 154-157, Feb. 1992.

Ekimov, A.I. et al., "Fast switching of the transmission of light by glasses activated with CdS microcrystals," *Sov. Phys. Semicond.*, vol. 25 No. 2, 164-166 (1991).

Ekimov, A.I. et al., "Resonance Raman Spectroscopy of Electron-Hole Pairs—Polar Phonon Coupling in Semiconductor Quantum Microcrystals," *Solid State Communications*, vol. 78, No. 10, pp. 853-856, 1991.

Ekimov, A.I. et al., "Optics of Zero Dimensional Semiconductor Systems, *Acta Physica Polonica A*," vol. 79 (1991), No. 1. pp. 5-14.

Ekimov, A.I. et al., "Optical Properties of Semiconductor Quantum Dots in Glass Matrix," *Physica Scripta*. vol. T39, 217-222 (1991).

Ekimov, A.I. et al. "Rapid Processes of Darkening and Bleaching in CdS Doped Glasses," *Superlattices and Microstructures* vol. 10, No. 3, 307-310 (1990).

Ekimov, A.I. et al., "Auger ionization of semiconductor quantum drops in a glass matrix," *Journal of Luminescence* 47 (1990) 113-127 North-Holland.

Ekimov, A.I. et al., "Time-Resolved Luminescence of CdSe Microcrystals," *Solid State Communications*, vol. 74, No. 7, pp. 555-557, 1990.

Ekimov, A.I. et al., "Quantum-Size Stark Effect in Semiconductor Microcrystals," *Journal of Luminescence* 46 (1990) 97-100 North-Holland.

Ekimov, A.I. et al., "Spectra and Decay Kinetics of Radiative Recombination in CdS Microcrystals," *Jounal of Luminescence* 46 (1990) 83-95 North-Holland.

Ekimov, A.I. et al., "Influence of high hydrostatic pressures on the exciton spectrum of CdS microcrystals in glass," *Sov. Phys. Semicond.* 23(9), Sep. 1989, pp. 965-966.

Ekimov, A.I. et al., "Photoluminescence of quasizero-dimensional semiconductor structures," *Sov. Phys. Solid State* 31(8), Aug. 1989, pp. 1385-1393.

Ekimov, A.I. et al., "Photoionization of semiconducting microcrystals in glass," *Sov. Phys. Solid State* 31(1), Jan. 1989, pp. 149-151.

Ekimov, A.I. et al., "Donor-like Exciton in Zero-Dimension Semiconductor Structures," *Solid State Communications*, vol. 69, No. 5, pp. 565-568, 1989.

Ekimov, A.I. et al., "Nonlinear Optics of Semiconductor-Doped Glasses," *Phys. Stat. Sol.* (b) 150, (1988) pp. 627-633.

Ekimov, A.I. et al., "Nonlinear optical properties of semiconductor microcrystals," *JETP Lett.*, vol. 46, No. 10, Nov. 25, 1987 pp. 435-439.

Ekimov, A.I. et al., "Quantization of the energy spectrum of holes in the adiabatic potential of the electron," *JETP Lett.*, vol. 43, No. 6, Mar. 25, 1986, pp. 376-379.

Ekimov, A.I. et al., "Quantum Size Effect in Semiconductor Microcrystals," *Solid State Communications*, vol. 56, No. 11, pp. 921-924, 1985.

Ekimov, A.I. et al., "Size quantization of the electron energy spectrum in a microscopic semiconductor crystal," *JETP Lett.*, vol. 40, No. 8, Oct. 25, 1984, pp. 1136-1139.

Ekimov, A.I. et al., "Quantum size effect in the optical spectra of semiconductor microcrystals," *Sov. Phys. Semicond.* 16(7), Jul. 1982, pp. 775-778.

Ekimov, A.I. et al., "Quantum size effect in three-dimensional microscopic semiconductor crystals," *JETP Lett*, vol. 34, No. 6, Sep. 20, 1981, pp. 345-349.

Ekimov, A.I. et al., "Oscillations of polarization of recombination radiation of a variable gap semiconductor in a magnetic field," *JETP Lett.*, vol. 25 No. 55, 526-528 (1977).

\* cited by examiner

NON-VOLATILE MEMORY DEVICE INCLUDING SEMICONDUCTOR CHARGE-TRAPPING MATERIAL PARTICLES

PRIORITY CLAIM

This application claims priority to U.S. Application No. 60/508,272, filed Oct. 6, 2003, which is incorporated by reference in its entirety.

FEDERALLY SPONSORED RESEARCH OR DEVELOPMENT

This invention was made with government support under Grant No. DMR-0213282, awarded by NSF. The government has certain rights in the invention.

TECHNICAL FIELD

The invention relates to a non-volatile memory device.

BACKGROUND

Non-volatile memory is a component of a growing number of portable products. Non-volatile floating gate memory devices can include a gate of metal-oxide semiconductor field effect transistors (MOSFETs). The memory operation of field effect transistors depends on charge storage of the material used to form the active portion of the device. In these floating gate memory devices, the material of the active portion of the device acts as a charge storage element located within the gate oxide of a MOSFET. Injecting charge into the material can lead to tunneling from the channel, which can alter the threshold voltage of the transistor. A typical write/read/erase cycle includes information being written by injecting charge from the channel into the material, reading by measuring the sub-threshold current-voltage characteristics, and erasing by removing charge from the particles to the channel. The performance of the non-volatile memory device can depend, in part, on the composition of the active portion of the device.

SUMMARY

In one aspect, a memory device includes a layer including a plurality of a charge trapping material. The plurality of the charge trapping material has a size dispersity of less than 50%. The size dispersity can be less than 30%, less than 20%, or less than 10%.

In another aspect, a memory device includes a layer including a plurality of a charge trapping material. Each of the charge trapping material includes a core and an outer layer selected to form the layer upon deposition.

In another aspect, a memory device includes a layer of a plurality of a charge trapping material. Each of the charge trapping material can be selected to decrease lateral conductivity within the layer relative to a layer of the core without the outer layer.

In another aspect, a memory device includes a floating gate transistor including an insulator, a layer of charge trapping material over the insulator, and an organic upper gate layer formed over the layer of charge trapping material.

In another aspect, a memory device includes a layer including more than one composition or size distribution of a charge trapping material.

In another aspect, a method of manufacturing a memory device includes forming a layer including a plurality of a charge trapping material on a substrate, the plurality of the charge trapping material having a size dispersity of less than 50%, and forming electrical contacts proximate to the layer to form an active layer of the memory device.

In another aspect, a method of manufacturing a memory device includes forming an outer layer selected to form the layer upon deposition or to decrease lateral conductivity within a layer of the plurality of nanoparticles relative to a layer of the nanoparticles without the outer layer on a plurality of cores, and depositing the plurality of cores on a surface to form an active layer of the memory device. The method can include combining an M-source and an X donor to form the plurality of cores.

In another aspect, a method of forming a memory device includes selecting a matrix material and an active material which are mutually immiscible, dissolving the matrix material and the nanoparticle in a solvent to form a coating solution, and coating a substrate with the coating solution to form a layer of active material of the device. Coating the substrate with the coating solution can include spin coating.

In some embodiments, the charge trapping material can include an organic charge trapping moiety. In other embodiments, the charge trapping material can include an inorganic core.

The core can include a nanoparticle. The nanoparticle can include a semiconductor nanocrystal (or quantum dot, QD). In certain embodiments, the device can include a matrix material and a plurality of nanoparticles phase separated from the matrix material.

Within the device, the nanoparticle can form a layer, for example a monolayer, on a substrate. The monolayer can be formed by methods or modification of methods described in U.S. application Ser. No. 10/400,907, filed Mar. 28, 2003, which is incorporated by reference in its entirety. The memory device can include a floating-gate field effect transistor. The core can be a semiconductor material, for example, a binary or ternary semiconductor material. The outer layer of each nanoparticle can electrically isolate each core, limiting or reducing lateral conduction in the layer. This structure can produce a non-volatile memory device that has program/erase characteristics comparable to conventional stacked gate non-volatile memory devices, excellent read/erase cycling performance, and improved long-term non-volatility in comparison to a thin, lower gate or, tunnel oxide-based memory device. The nanoparticle can include an overcoating between the core and the outer layer. The overcoating can be a semiconductor material.

The nanoparticles can be close packed in the layer. The layer can have a particle density ranging from $10^{12}$ to $10^{13}$ particles/centimeter$^2$.

The memory device can be a simple, low cost device fabrication since the organic layer and active layer can be prepared in a single step. The conductivity of the active layer can be tuned, which can improve the retention characteristics of the device. The structure of the device can enable the use of thinner structures.

The details of one or more embodiments are set forth in the description below. Other features, objects, and advantages will be apparent from the description and from the claims.

DETAILED DESCRIPTION

A memory device can include a room-temperature-integratable memory element. The memory element can be used in numerous electronic technology platforms, including organic, III-V, and even silicon electronics. The memory element can be a non-volatile memory device including a layer of charge trapping material having a selectable lateral conductivity, such as nanoparticles having a selectable outer layer. The memory element can be manufactured using room-temperature methodology to form a hybrid organic/inorganic device.

Figure 1:
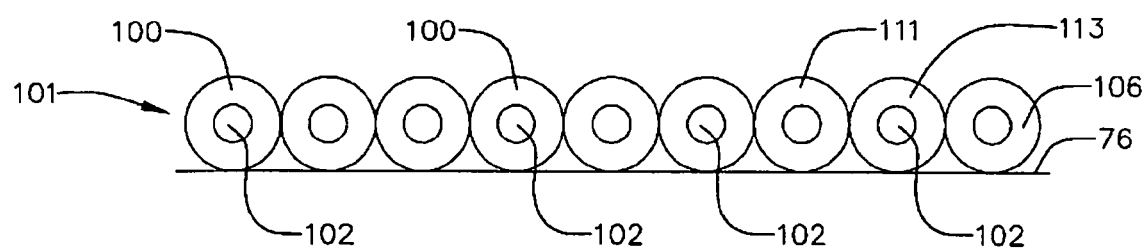
FIG. 1 is a schematic drawing depicting a layer of active material.

The memory element can be a chip-scale memory cell array. A chip-scale memory cell array can be formed by employing the charge trapping properties of nanoparticles monolayers. The individual memory cell configuration includes a field effect transistor structure in which nanoparticles form a floating gate. An example of this structure is shown in FIG. 1. The device is similar to other devices based on other materials, but has a number of advantages over those devices. Examples of other devices are described, for example, in S. Tiwari et al., "Volatile and Non-Volatile Memories in Silicon with Nano-Crystal Storage," IEDM 95-521 (1995) and J. De Blauwe, "Nanoparticle Nonvolatile Memory Devices," *IEEE Trans. Nanotechnology* 1, 72 (2002), each of which is incorporated by reference in its entirety. In the device, the floating gate can be electrically insulated from the outside circuit making it possible to trap charge in the layer including the nanoparticle. The trapped charge, at the floating gate, can be supplied by injection from the top-gate contact through the organic thin film. The charged floating gate can modulate the carrier mobility through the source-drain channel on the semiconductor, which, in turn, is interpreted as the on/off state of the memory cell.

Memory retention time of the device depends on the charge trapping properties of nanoparticles and also lateral conduction in the layer including the nanoparticles. For example, in a conventional floating-gate-transistor memory-cell an insulated metal layer is used as the floating gate electrode. Manufacturing of such devices, however, introduces parasitic charge-leakage pathways at defect sites of the insulator layer and at contact edges. This problem increases in magnitude with cell miniaturization, and has presently limited the minimum oxide thickness to 9-11 nm in a typical cell with a metal floating gate. See, for example, J. De Blauwe, "Nanoparticle Nonvolatile Memory Devices," *IEEE Trans. Nanotechnology* 1, 72 (2002). Advantageously, a nanoparticle floating gate can benefit from poor lateral conductivity, which can inhibit charge leakage and, therefore, can extend the memory retention time of the nanoparticle-memories. In certain circumstances, the defects in the oxide can only affect the nanoparticles in the vicinity of the defect, while the remainder of the charged nanoparticles remain unaffected, retaining memory. Nanoparticle-memories can have excellent immunity to stress-induced leakage current and oxide defects due to the distributed nature of the charge storage in the nanoparticle layer.

FIG. 1 shows a cross-sectional view of a layer 101 including active materials 100. The active material 100 includes core 102 and, optionally includes an outer layer 106. The plurality of adjacent active material 100 contact each other laterally and can form a monolayer. Because each active material includes outer layer 106 formed on each active material 100, adjacent cores 102 are electrically insulated from one another and lateral shorting is precluded. The layer can be a component of a memory device, such as a floating gate of a non-volatile memory, floating gate transistor.

Core 102 can be formed of a charge trapping material, such as a charge trapping organic moiety (i.e., an organic moiety that can be electrochemically oxidized or reduced, such as, for example, $Alq_3$, or PTCDA, an inorganic moiety that can be electrochemically oxidized or reduced, such as, for example, an inorganic nanoparticle (e.g., a semiconductor nanocrystal or a metal nanoparticle) or a metal complex). When the core 102 includes a nanoparticle, the nanoparticle can include an overcoating layer can be interposed between the core 102 and outer layer 106. The charge trapping material can be selected to form a layer of charge trapping material upon deposition, and to decrease lateral conductivity within the layer.

The nanoparticle can be a gold nanoparticle, a cobalt nanocrystal, an iron oxide nanocrystal, or a semiconductor nanocrystal including a semiconductor material, such as a Group II-VI compound, a Group II-V compound, a Group III-VI compound, a Group III-V compound, a Group IV-VI compound, a Group I-III-VI compound, a Group II-IV-VI compound, or a Group II-IV-V compound. The semiconductor material can be ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof. The second semiconductor material can be ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

Figure 2:
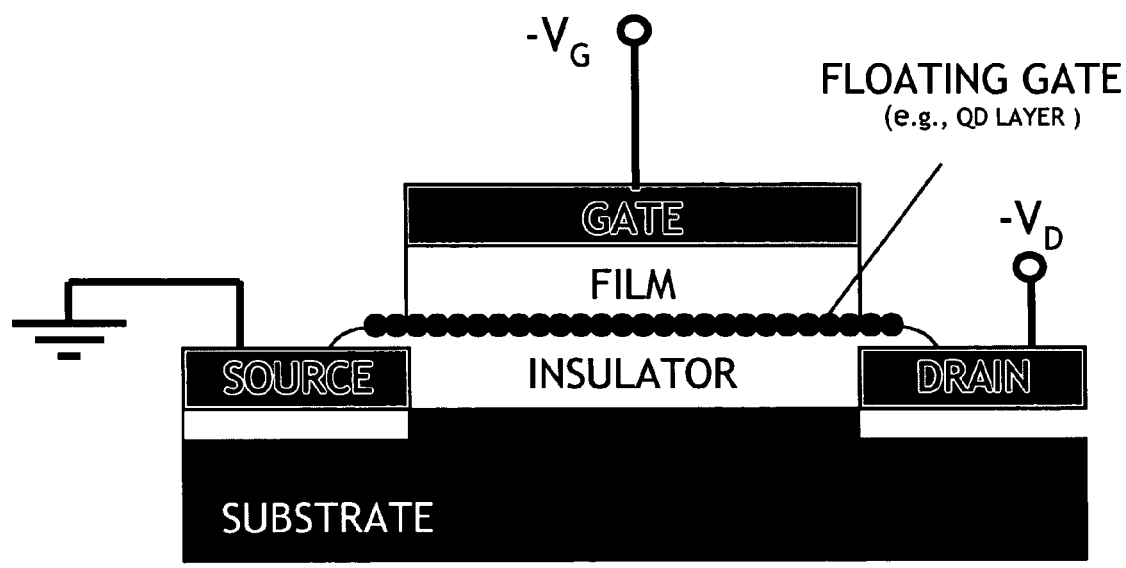
FIG. 2 is a schematic drawing of a memory cell based on the gated transistor action, in which charge on the floating gate, consisting of a charge trapping material, modulates conduction through the source-drain channel on the semiconductor.
Figure 3:
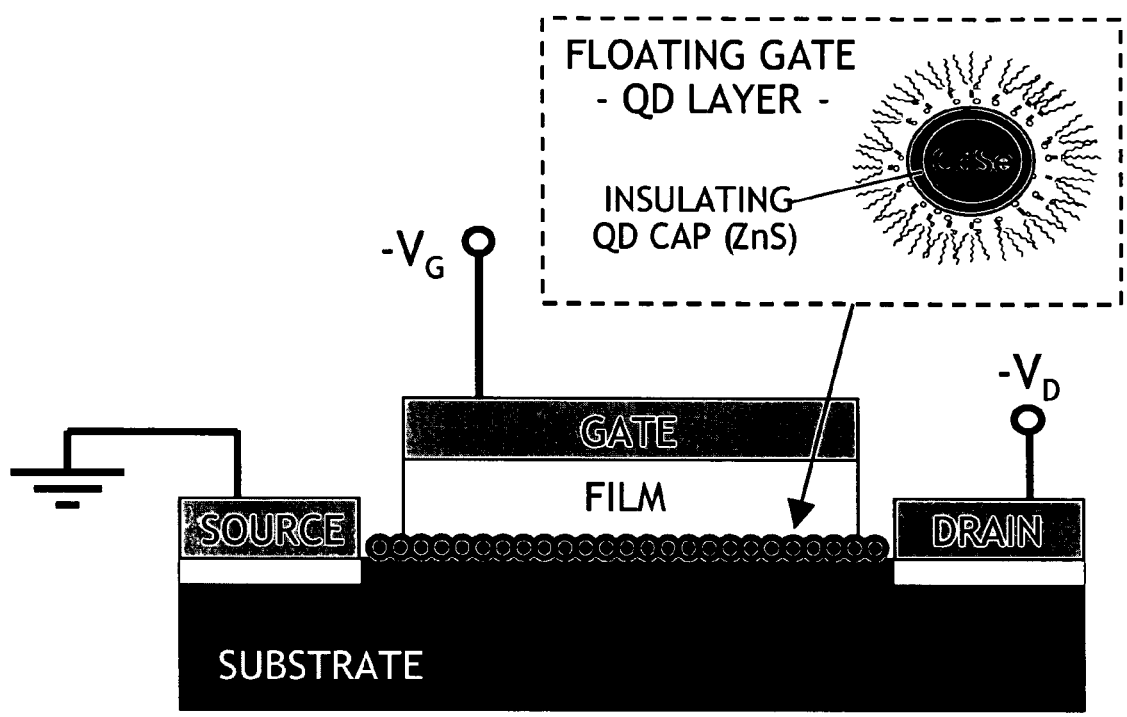
FIG. 3 is a schematic drawing of a nanoparticle floating gate memory cell that includes a charge trapping material layer as the floating gate insulator.

Furthermore, nanoparticles can be prepared that contain an insulating shell layer so that the oxide layer can be eliminated entirely and the thin (2-4 nm) insulating shell can serve as the dielectric. An example of this type of device is shown in FIG. 2. The shell material can be chosen to have a high dielectric constant such as Hf-oxide or Zr-oxide to further reduce the operating gate voltage and enhance the shift in transistor threshold upon nanoparticle charging. The operating voltage for the nanoparticle-memory write cycle can be reduced by optimizing charge injection at the organic/gate-metal contact. In other embodiments, the nanoparticle layer represented in FIG. 2 can be replaced with an all organic layer of energy structure equivalent to that of the nanoparticles. The organic layer can trap charges and serve as the floating gate. A different device can be structured having an active layer between two electrodes. Between the active layer and the first electrode can be a first electron transport layer, and between the active layer and the second electrode can be a second electron transport layer. Electron or hole mobility through the first and second transport layer is different. This difference in mobility can allow the active layer to be selectively charged (i.e., by applying high voltage of a first bias), discharged (i.e., by applying high voltage of a second bias opposite the first bias), or read (i.e., by applying a read voltage).

Figure 5:
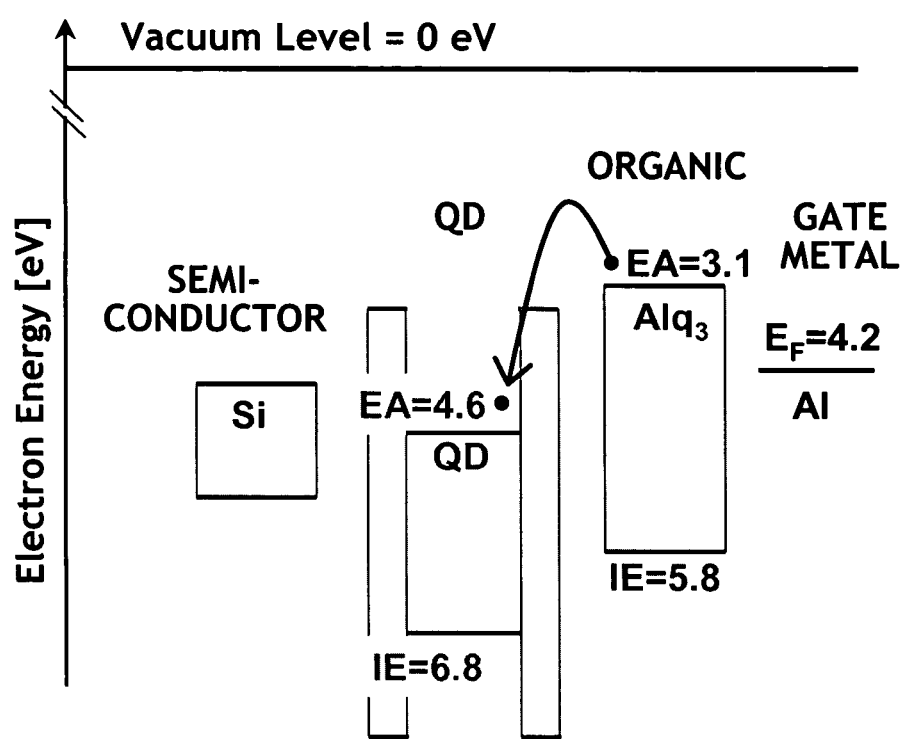
FIG. 5 is an electron energy level diagram for the set of layers under the gate illustrating an example of an electron trapping process.

The energy band diagram in FIG. 5 indicates that nanoparticles are deep traps for electrons due to their high electron affinity. Conduction studies through close packed nanoparticle layers also implicate charge trapping as dominant in determining nanoparticle conduction, confirming that lateral conductivity through the nanoparticle layer of nanoparticle-memories will be poor, as needed for long retention time cells. See, for example, C. A. Leatherdale et al. "Photoconductivity in CdSe quantum dot solids," *Phys. Rev. B* 62, 2669 (2000) and N. Y. Morgan et al, "Electronic Transport in Films of Colloidal CdSe NCs," *Phys. Rev. B* 66, 075339-1 (2002), each of which is incorporated by reference in its entirety.

Figure 4:
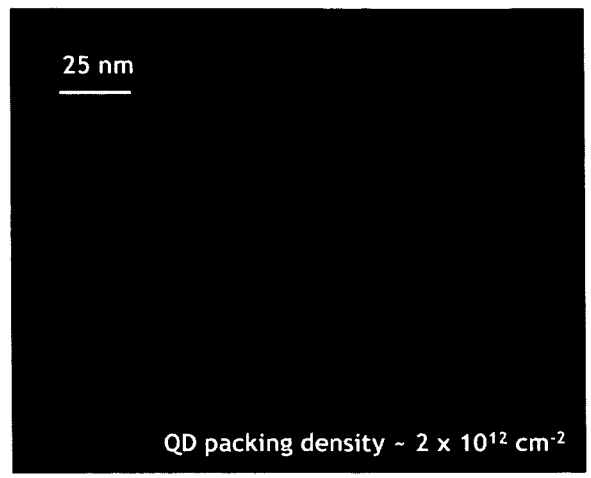
FIG. 4 is an atomic force microscopy image of a hexagonally close-packed array of nanoparticles.

Chip-scale manufacturing of memory cell arrays can be enhanced by the phase segregation of nanoparticles during spin-casting that was used to produce nanoparticle-LEDs. See, U.S. patent application Ser. No. 10/400,907, filed Mar. 28, 2003, and, S. Coe, W. Woo, M. G. Bawendi, and V. Bulović, "Electroluminescence from Single Monolayers of Nanoparticles in Molecular Organic Devices," accepted for publication in *Nature* (2002), each of which is incorporated by reference in its entirety. The spin casting solution can be a mixture of nanoparticles and dissolved molecular organic materials. Upon spin-casting, a bilayer can be formed which includes a nanoparticle monolayer adjacent to an organic thin film. This phase segregation process can be governed by the physical size and chemical character of the two constituents; the organic molecules in the solution can be small (~1 nm) and have aromatic character, while the nanoparticles can be large in comparison (>3 nm) and present a surface that includes mostly alkane chains. In general, phase segregation can result from the interaction between any pair of materials with disparate chemical functionality. For consistent nanoparticle-memory performance and production uniformity, nanoparticle concentrations in organic/nanoparticle solutions can be optimized for the formation of complete single nanoparticle monolayers. One approach to a device includes a minimal requirement is to develop a trapped charge density of $10^{12}$ $cm^{-2}$, which, assuming one charge per nanoparticle, translates to a close-packed array of nanoparticles with a size less than 6 nm. An example of such an array is shown in FIG. 4. A packing density has been achieved for nanoparticles as small as 3 nm in size can form a layer capable of having a trapped charge density suitable to form a memory device.

Although the floating gate memory cells can be directly applicable to gating silicon channels, the exceptional performance of today's Si-based memories makes it hard to envision the need for enhancements that nanoparticle-memories bring. Nanoparticle-memories can be used to integrate memory cell elements on II-V substrates such as InP. InP electronics, although intrinsically faster than silicon due to high carrier mobilities, can be hampered in development by the lack of a native oxide layer. Furthermore, the lack of the complementary MOS technology prevents the development of low-power-dissipation memories. The nanoparticle-floating gate does not require a native oxide and would, therefore, be compatible with InP processing. Also, equivalently to complementary MOS, the memory function is not power dissipative and could, therefore, enable the development of InP memories. Integration of electrical InP/nanoparticle elements with optical InP components on a single chip is an enabling step to the development of optoelectronic integrated circuits on a chip.

Nanoparticle-memories can be integrated into flexible electronic structures including active organic transistor materials. Organic circuits presently do not have stable memory elements, which, if developed, would benefit technologies such as the memory behind display pixels and ink-jet printable memory. Advantageously, the devices can be prepared at temperatures close to room temperature, which can allow inorganic/organic hybrid structures to be prepared. In addition, the spin coating procedure used to deposit the materials can facilitate processing on any flat substrate. Another advantage is that the nanoparticle structures can have the oxide layer integral to the nanoparticle structure and its thickness can be adjusted from a single monolayer to any specified thickness by a simple controllable synthetic route.

As shown in FIG. 2, the active layer, or floating gate, can be formed over an insulator, such as an oxide, or a tunnel oxide, formed over gate regions of transistors. The insulator is formed over a surface of the substrate including over a gate area. An upper gate, such as a film, which can be an organic film, and gate electrode film are formed above the active layer. After the films are formed over one another, including over the gate area, situated between source/drain regions conventional patterning and etching techniques can be used to define the gate region and to form a gate electrode structure. A plurality of such structures can be formed simultaneously on a substrate according to the above process. The floating gate can include a single particle size distribution of charge trapping material, or a single composition of charge trapping material, or a plurality of particle size distributions or compositions of charge trapping material having electronically indistinguishable band gaps, to form a binary device. In other embodiments, the floating gate can include a plurality of particle size distributions or compositions of charge trapping material having electronically distinguishable band gaps, to form higher order devices, or multilevel logic devices. The tunable nature of the band gap of semiconductor nanocrystals make these materials a desirable choice when building this type of device.

A gate structure includes a gate width, which can be less than 0.2 microns. For example, the width can be 0.18 microns to 1.2 microns. The thickness of the insulator and thickness of upper gate film can be chosen in conjunction with the composition of the active layer. The thicknesses are chosen such that the total, or effective thickness, can be in the range of 3-12 nanometers, or 4-8 nanometers. The thickness can be 3-12 nanometers, or 3-6 nanometers. The thickness of upper gate film can be chosen so that total, or effective thickness of the upper gate lies within the range of 6-15 nanometers, for example, in the range of 10-15 nanometers. Various conventional films suitable for use as gate electrode may be used and may be formed to various suitable thicknesses. The transistor gate structure can be formed over a channel region and between source/drain regions. In certain embodiments, each of tunnel film and upper gate can be formed of other dielectric materials. Memory devices are described, for example, in U.S. Pat. No. 6,586,785, which is incorporated by reference in its entirety.

The outer surface of the nanoparticle includes an organic layer derived from the coordinating solvent used during the growth process. This surface can be modified by exposure (for example, repeated exposure) to an excess of a competing coordinating group. For example, a dispersion of the capped nanoparticle can be treated with a coordinating organic compound, such as pyridine, to produce crystallites which dispersed readily in pyridine, methanol, and aromatics but no longer dispersed in aliphatic solvents. Such a surface exchange process can be carried out with any compound capable of coordinating to or bonding with the outer surface of the nanoparticle, including, for example, phosphines, thiols, amines and phosphates. The nanoparticle can be exposed to short chain polymers which exhibit an affinity for the surface and which terminate in a moiety having an affinity for the suspension or dispersion medium. Such affinity improves the stability of the suspension and discourages flocculation of the nanoparticle.

The chemical properties of the surrounding ligand shell can make the nanoparticles soluble within or reactive with a matrix material. The matrix material can be an inorganic material or an organic material. The surrounding ligand shell has exposed ligand moieties. When the exposed ligand moieties are chemically similar to the matrix material, the nanoparticles are soluble in the matrix. When the exposed ligand moieties and matrix material are chemically dissimilar, the nanoparticles are not soluble within the matrix. The ligand moieties can have the formula:

$$(Y)_{k-n}-X-(L)_n$$

wherein k is 2, 3 or 5, and n is 1, 2, 3, 4 or 5 such that k-n is not less than zero; X is O, S, S=O, $SO_2$, Se, Se=O, N, N=O, P, P=O, As, or As=O; each of Y and L, independently, is aryl, heteroaryl, or a straight or branched $C_{2-12}$ hydrocarbon chain optionally containing at least one double bond, at least one triple bond, or at least one double bond and one triple bond, the hydrocarbon chain being optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$ cycloalkyl, 3-5 membered heterocycloalkyl, aryl, heteroaryl, $C_{1-4}$ alkylcarbonyloxy, $C_{1-4}$ alkyloxycarbonyl, $C_{1-4}$ alkylcarbonyl, or formyl and the hydrocarbon chain being optionally interrupted by —O—, —S—, —N($R^a$)—, —N($R^a$)—C(O)—O—, —O—C(O)—N($R^a$)—, —N($R^a$)—C(O)—N($R^b$)—, —O—C(O)—O—P($R^a$)—, or —P(O)($R^a$)—; and each of $R^a$ and $R^b$, independently, is hydrogen, alkyl, alkenyl, alkynyl, alkoxy, hydroxylalkyl, hydroxyl, or haloalkyl.

An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, or phenanthryl.

A suitable coordinating ligand can be purchased commercially or prepared by ordinary synthetic organic techniques, for example, as described in J. March, *Advanced Organic Chemistry*, which is incorporated by reference in its entirety.

When the exposed ligand moieties and the matrix material are chemically dissimilar, a phase segregated material can be produced. The nanoparticles having the ligand shell with exposed ligand moieties and a chemically dissimilar matrix material can be dissolved in a mutual solvent to generate a film-forming solution. The solution can be deposited on a substrate, for example, by drop coating, dip coating or spin coating, to form a film. When dried, the film contains a layer of matrix material and a layer of nanoparticles. Either layer may be discontinuous, depending on the concentration of the nanoparticles or matrix material in the film-forming solution. For example, if the nanoparticles form a discontinuous layer, the nanoparticles form islands of a higher concentration of nanoparticles contacting a continuous layer of matrix material. In this manner, multiple layers are formed in a single film-forming deposition step.

Material phase segregation can be used to create a spin-cast thin film bilayer structure. The chemical characteristics of the two components (the matrix and the charge trapping material) are chosen so that layered phase segregation results. For example, a bilayer structure consisting of a bottom layer of N,N'-diphenyl-N,N'-bis(3-methylphenyl)-1, 1'-biphenyl-4, 4'-diamine (TPD) is covered with a layer of self-assembled colloidal semiconductor nanoparticles as a monolayer. The TPD consists in large part of aromatic groups, while the nanoparticles have a ligand shell that exposes a surface which mostly consists of alkyl chains (trioctylphosphine/trioctylphosphine oxide). There can also be a large size difference between the molecular matrix, typically about 1 nm or less, and the colloidal nanoparticles, typically greater than 3 nm. While this example employs aromatic/aliphatic chemical pairs, any pair of moieties or functional groups can be used such that phase separation will occur. For example, nanoparticles that would display a highly polar surface (e.g. OH groups) can phase separate in a layered film upon spin-coating if the other molecule is mostly non-polar. The bilayer structure can used to fabricate efficient light emitting devices (LEDs).

The solubility of the nanoparticles and matrix material in the solvent can be on the order of 10 mg/mL to allow for a large range of possible solution mixtures and film thicknesses. Additionally, the matrix material can be selected to maximize phase segregation with the nanoparticles.

Methods of preparing monodisperse semiconductor nanoparticles include pyrolysis of organometallic reagents, such as dimethyl cadmium, injected into a hot, coordinating solvent. This permits discrete nucleation and results in the controlled growth of macroscopic quantities of nanoparticles. Preparation and manipulation of nanoparticles are described, for example, in U.S. Pat. No. 6,322,901, which is incorporated herein by reference in its entirety. The method of manufacturing a nanoparticle is a colloidal growth process. Colloidal growth occurs by rapidly injecting an M donor and an X donor into a hot coordinating solvent. The injection produces a nucleus that can be grown in a controlled manner to form a nanoparticle. The reaction mixture can be gently heated to grow and anneal the nanoparticle. Both the average size and the size distribution of the nanoparticles in a sample are dependent on the growth temperature. The growth temperature necessary to maintain steady growth increases with increasing average crystal size. The nanoparticle is a member of a population of nanoparticles. As a result of the discrete nucleation and controlled growth, the population of nanoparticles obtained has a narrow, monodisperse distribution of diameters. The monodisperse distribution of diameters can also be referred to as a size. The process of controlled growth and annealing of the nanoparticles in the coordinating solvent that follows nucleation can also result in uniform surface derivatization and regular core structures. As the size distribution sharpens, the temperature can be raised to maintain steady growth, or control size, or both. By adding more M donor or X donor, the growth period can be shortened, or size controlled.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula Mx. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl) selenide (($TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride (($TMS)_2Te$), bis(trimethylsilyl)sulfide (($TMS)_2S$), a trialkyl phosphine sulfide such as (tri-n-octylphosphine) sulfide (TOPS), an ammonium salt such as an ammonium halide (e.g., NH$_4$Cl), tris(trimethylsilyl) phosphide ((TMS)$_3$P), tris(trimethylsilyl) arsenide ((TMS)$_3$As), or tris(trimethylsilyl) antimonide ((TMS)$_3$Sb). In certain embodiments, the M donor and the X donor can be moieties within the same molecule.

A coordinating solvent can help control the growth of the nanoparticle. The coordinating solvent is a compound having a donor lone pair that, for example, has a lone electron pair available to coordinate to a surface of the growing nanoparticle. Solvent coordination can stabilize the growing nanoparticle. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanoparticle production. Examples of suitable coordinating solvents include pyridine, tri-n-octyl phosphine (TOP), tri-n-octyl phosphine oxide (TOPO) and tris-hydroxylpropylphosphine (tHPP). Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals, control size distribution, and control shape. By stopping growth at a particular nanoparticle average diameter and choosing the proper composition of the semiconducting material, the emission spectra of the nanoparticles can be tuned continuously over the wavelength range of 300 nm to 5 microns, or from 400 nm to 800 nm for CdSe and CdTe. The nanoparticle has a diameter of less than 150 Å. A population of nanoparticles has average diameters in the range of 15 Å to 125 Å. The synthesis of semiconductor nanoparticles is described, for example, in U.S. Pat. Nos. 6,207,229, 6,576,291 and U.S. Application No. 60/497,706, filed Aug. 26, 2003, each of which is incorporated by reference in its entirety.

The nanoparticle can be a member of a population of nanoparticles having a narrow size distribution. The nanoparticle can be a sphere, rod, disk, or other shape. The nanoparticle can include a core of a semiconductor material. The nanoparticle can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The core can have an overcoating on a surface of the core. The overcoating can be a semiconductor material having a composition different from the composition of the core. The overcoat of a semiconductor material on a surface of the nanoparticle can include a Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnO, ZnS, ZnSe, ZnTe, CdO, CdS, CdSe, CdTe, HgO, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbO, PbS, PbSe, PbTe, or mixtures thereof. For example, ZnO, ZnS, ZnSe or CdS overcoatings can be grown on CdSe or CdTe nanoparticles. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained.

The particle size distribution can be further refined by size selective precipitation with a poor solvent for the nanoparticles, such as methanol/butanol as described in U.S. Pat. No. 6,322,901. For example, nanoparticles can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanoparticle population can have no more than a 15% rms deviation from mean diameter, preferably 10% rms deviation or less, and more preferably 5% rms deviation or less. When the charge trapping material includes a molecular species, the material is monodisperse by definition.

The outer surface of the nanoparticle can include a layer of compounds derived from the coordinating solvent used during the growth process. The surface can be modified by repeated exposure to an excess of a competing coordinating group to form an overlayer. For example, a dispersion of the capped nanoparticle can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanoparticle, including, for example, phosphines, thiols, amines and phosphates. The nanoparticle can be exposed to short chain polymers which exhibit an affinity for the surface and which terminate in a moiety having an affinity for a suspension or dispersion medium. Such affinity improves the stability of the suspension and discourages flocculation of the nanoparticle.

Layers including nanoparticles can be formed by redispersing the powder semiconductor nanoparticles described above in a solvent system and drop casting films of the nanoparticles from the dispersion. The solvent system for drop casting depends on the chemical character of the outer surface of the nanoparticle, i.e., whether or not the nanoparticle is readily dispersible in the solvent system. The drop cast films are dried in an inert atmosphere for about 12 to 24 hours before being dried under vacuum. Typically, the films are formed on substrates.

Transmission electron microscopy (TEM) can provide information about the size, shape, and distribution of the nanoparticle population. Powder x-ray diffraction (XRD) patterns can provided the most complete information regarding the type and quality of the crystal structure of the nanoparticles. Estimates of size are also possible since particle diameter is inversely related, via the X-ray coherence length, to the peak width. For example, the diameter of the nanoparticle can be measured directly by transmission electron microscopy or estimated from x-ray diffraction data using, for example, the Scherrer equation. It also can be estimated from the UV/Vis absorption spectrum.

The choice of organic host for the nanoparticles can be limited by material deposition methods. A layer can be formed by Langmuir-Blodgett methods (see, Dabbousi et al., Chemistry of Materials, 1994, 6, which is incorporated by reference in its entirety), evaporative methods, dip coating or spin coating. CdSe nanoparticles are typically arranged into thin films by spin-casting from solution. While spin-casting is possible for molecular organics, and typical for polymer organics, it limits the available organic matrix materials to those that are highly soluble in solvents such as toluene, hexanes and chloroform, which are the preferred solvents for the TOPO capped nanoparticle colloids. In order to have a large range of possible solution mixtures and flm thicknesses, it is necessary to have organic solubility in the range of 10 mg/mL. Such is the case for TPD in chloroform. TPD has the added advantage of being a blue emitting material, which can facilitate access to the entire visible spectrum by doping different sized nanoparticles into this organic matrix.

In one example of forming a bilayer, TPD and nanoparticles can be dispersed in a suitable solvent (chloroform in this case); the mixed solution is spin-cast on top of pre-cleaned ITO substrates. The phenyl/benzyl groups of the TPD and the alkyl groups covering the nanoparticle surfaces cause the two materials to phase segregate and result in the formation of a TPD/nanoparticle bilayer structure while the chloroform evaporates. The spin-casting is performed in a controlled (oxygen-free and moisture-free) environment in order to obtain highly reproducible heterostructures. Appropriate layer(s) of molecular organics followed by the metal electrode layers are then deposited via thermal evaporation. The self-assembled nanoparticle monolayer can be positioned in the recombination zone of the multilayer active organic electroluminescent device. Confinement of nanoparticles to the device active region maximizes the efficiency of nanoparticles material usage.

The process is very general. For example, controlled phase separation has been successful with CdSe, CdSe(ZnS), and PbSe nanoparticles with TOPO capping ligands, and oleic acid capping ligands. The matrix of the controlled phase separated structures can be organic molecules, such as N,N'-di-[(1-naphthalenyl)-N,N'-diphenyl]-1,1'-biphenyl)-4,4'-diamine (NPD) and TPD, as well as a polymerized version of TPD. Controlled phase separation has been successful using different solvents, including chloroform and chlorobenzene. Changing the size of the nanoparticles, for example, from 3 nm to 9 nm continued to result in efficient phase separation. In terms of controlling the process, lower vapor pressure solvents, which take longer to evaporate during spin coating, increase the degree of order found on the monolayer film of nanoparticles. For example, the nanoparticles can become hexagonally packed, for example, to a packing density of greater than $10^{11}$/centimeter$^2$, such as $10^{12}$/centimeter$^2$. Also, very narrow size distributions of nanoparticles increase the degree of observed hexagonal ordering in the nanoparticle layer.

Sheets of single nanoparticle monolayers, square centimeters in size, can be employed in electrically active devices, minimizing nanoparticle material use to the active device region. The material phase segregation that governs formation of the organic/nanoparticle spin-cast thin film bilayers is a general and widely applicable fabrication process. The process is governed by the physical size and chemical character of the two solvated constituents; the TPD molecules are small (~1 nm) and have aromatic character, while the nanoparticles are large in comparison (>3 nm) and present a surface that consists of mostly alkyl chains. In general, phase segregation is not limited to aromatic/aliphatic pairs, but governs the interaction between any pair of materials with disparate chemical functionality.

Other embodiments are within the scope of the following claims.

What is claimed is:

1. A memory device comprising a source drain channel and a layer including a plurality of a charge trapping material, wherein at least one of the charge trapping material includes a core including an overcoating layer, and an outer layer on the core, wherein the outer layer includes a semiconductor material selected from Group II-VI compounds, Group II-V compounds, Group III-VI compounds, Group III-V compounds, Group IV-VI compounds, Group I-III-VI compounds, Group II-IV-VI compounds, and Group II-IV-V compounds, the charge trapping material is selected to decrease lateral conductivity within the layer relative to a layer of the core without the outer layer, and the plurality of the charge trapping material has a size dispersity of less than 50%, wherein the plurality of charge trapping nanoparticles includes a plurality of nanocrystals, wherein the plurality of nanocrystals is colloidally-grown and each nanocrystal has a surrounding ligand shell, wherein the ligand shell includes exposed ligand moieties.

2. A memory device comprising a source drain channel and a layer including a plurality of a charge trapping material, wherein each of the charge trapping material includes a core including an overcoating layer, and an outer layer selected to form the layer upon deposition, wherein the outer layer includes a semiconductor material selected from Group II-VI compounds, Group II-V compounds, Group III-VI compounds, Group III-V compounds, Group IV-VI compounds, Group compounds, Group II-IV-VI compounds, and Group II-IV-V compounds, and each of the charge trapping material is selected to decrease lateral conductivity within the layer relative to a layer of the core without the outer layer, wherein the plurality of charge trapping nanoparticles includes a plurality of nanocrystals, wherein the plurality of nanocrystals is colloidally-grown and each nanocrystal has a surrounding ligand shell, wherein the ligand shell includes exposed ligand moieties.

3. A memory device comprising a source drain channel and a layer including more than one composition or size distribution of a charge trapping material, wherein at least one of the compositions of charge trapping material comprises a core including an overcoating layer, and an outer layer, the outer layer includes a semiconductor material selected from Group II-VI compounds, Group II-V compounds, Group III-VI compounds, Group III-V compounds, Group IV-VI compounds, Group compounds, Group II-IV-VI compounds, and Group II-IV-V compounds, and the charge trapping material comprising the core and the outer layer is selected to decrease lateral conductivity within the layer relative to a layer of the core without the outer layer, wherein the plurality of charge trapping nanoparticles includes a plurality of nanocrystals, wherein the plurality of nanocrystals is colloidally-grown and each nanocrystal has a surrounding ligand shell, wherein the ligand shell includes exposed ligand moieties.

4. A memory device comprising a source drain channel and a layer of a plurality of a charge trapping material, wherein at least one of the charge trapping material includes a core including an overcoating layer, and an outer layer on the core, wherein the outer layer includes a semiconductor material selected from Group II-VI compounds, Group II-V compounds, Group III-VI compounds, Group III-V compounds, Group IV-VI compounds, Group I-III-VI compounds, Group II-IV-VI compounds, and Group II-IV-V compounds, and each of the charge trapping material is selected to decrease lateral conductivity within the layer relative to a layer of the core without the outer layer, wherein the plurality of charge trapping nanoparticles includes a plurality of nanocrystals, wherein the plurality of nanocrystals is colloidally-grown and each nanocrystal has a surrounding ligand shell, wherein the ligand shell includes exposed ligand moieties.

5. The device of any one of claim 4 or 3 wherein the charge trapping material includes an organic charge trapping moiety.

6. The device of any one of claim 4 or 3, wherein the charge trapping material has a particle density ranging from $10^{12}$ to $10^{13}$ particles/centimeter$^2$.

7. The device of any one of claim 4 or 3, wherein the charge trapping material forms a monolayer.

8. The device of any one of claim 4 or 3, wherein the device includes a matrix material and a plurality of charge trapping material phase separated from the matrix material.

9. The device of claim 8, wherein the matrix material is an organic material.

10. The device of any one of claim 4 or 3, wherein each of the plurality of nanocrystals includes a binary or ternary semiconductor material.

11. The device of claim 10, wherein the semiconductor material is ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, or PbTe.

* * * * *